(12) United States Patent
Guo et al.

(10) Patent No.: US 11,296,679 B2
(45) Date of Patent: Apr. 5, 2022

(54) PHASE SHIFTER

(71) Applicant: CommScope Technologies LLC, Hickory, NC (US)

(72) Inventors: Pengfei Guo, Suzhou (CN); Fangwen Wan, Suzhou (CN); Jinchun He, Suzhou (CN)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 17/002,956

(22) Filed: Aug. 26, 2020

(65) Prior Publication Data
US 2021/0075402 A1 Mar. 11, 2021

(30) Foreign Application Priority Data
Sep. 10, 2019 (CN) .......................... 201910849928.X (51) Int. Cl.
*H01P 1/18* (2006.01)
*H03H 11/22* (2006.01)
*H01P 1/06* (2006.01)

(52) U.S. Cl.
CPC ............. *H03H 11/22* (2013.01); *H01P 1/184* (2013.01); *H01P 1/06* (2013.01)

(58) Field of Classification Search
CPC ............ H03H 11/22; H01P 1/184; H01P 1/06
See application file for complete search history.

(56) References Cited

U.S. PATENT DOCUMENTS

| | | | | |
|---|---|---|---|---|
| 7,170,466 B2* | 1/2007 | Janoschka | ............... | H01P 1/184 333/156 |
| 7,907,096 B2* | 3/2011 | Timofeev | ................ | H01P 1/184 343/757 |
| 8,674,788 B2* | 3/2014 | Le | ............................ | H01Q 3/32 333/161 |
| 8,847,702 B2* | 9/2014 | Lai | ........................... | H01P 1/184 333/161 |
| 9,306,257 B2* | 4/2016 | Huynh | ..................... | H01P 5/028 |
| 10,424,839 B2* | 9/2019 | Li | ........................... | H01Q 1/246 |
| 2021/0013605 A1* | 1/2021 | Jang | ..................... | H01Q 1/1285 |

* cited by examiner

*Primary Examiner* — Dinh T Le
(74) *Attorney, Agent, or Firm* — Myers Bigel, P.A.

(57) ABSTRACT

The present disclosure relates to a phase shifter including an input port configured to receive a radio frequency (RF) signal; a first output port, a second output port, a third output port, and a fourth output port each configured to output a respective phase-shifted sub-component of the RF signal; a first conductive trace that extends in a first direction, the first conductive trace coupled to the first output port and the second output port; a second conductive trace that extends in the first direction, the second conductive trace coupled to the third output port and the fourth output port; and a first wiper configured to couple the input port to the first conductive trace and the second conductive trace, wherein the first wiper is configured to be slidable in the first direction with respect to the first conductive trace and the second conductive trace.

20 Claims, 5 Drawing Sheets

PHASE SHIFTER

RELATED APPLICATION(S)

The present application claims priority from and the benefit of Chinese Patent Application No. 201910849928.X, filed Sep. 10, 2019, the disclosure of which is hereby incorporated herein in its entirety.

FIELD

The present disclosure relates to a phase shifter.

BACKGROUND

A phase shifter is a device that is capable of adjusting the phase of a radio frequency (RF) signal. The phase shift can be introduced into the RF signal by transmitting the RF signal in a medium. The phase shifter is a device that uses this principle to change the phase of a RF signal.

SUMMARY

An aspect of the present invention is directed to a phase shifter. The phase shifter includes an input port configured to receive a radio frequency (RF) signal; a first output port, a second output port, a third output port, and a fourth output port each configured to output a respective phase-shifted sub-component of the RF signal; a first conductive trace that extends in a first direction, the first conductive trace coupled to the first output port and the second output port; a second conductive trace that extends in the first direction, the second conductive trace coupled to the third output port and the fourth output port; and a first wiper configured to couple the input port to the first conductive trace and the second conductive trace, wherein the first wiper is configured to be slidable in the first direction with respect to the first conductive trace and the second conductive trace.

In some embodiments according to the present invention, at least one of the first conductive trace and the second conductive trace may be a meandered trace.

In some embodiments according to the present invention, the meandered trace may be a periodic curve.

In some embodiments according to the present invention, the periodic curve may be one of a sinusoidal curve and a square wave curve.

In some embodiments according to the present invention, both the first conductive trace and the second conductive trace may be periodic curves and a period of the first conductive trace is different from a period of the second conductive trace.

In some embodiments according to the present invention, a height of the first conductive trace may be different from a height of the second conductive trace.

In some embodiments according to the present invention, a width of the first conductive trace may be different from a width of the second conductive trace.

In some embodiments according to the present invention, the phase shifter may further include a first dielectric substrate below the first conductive trace, and a second dielectric substrate below the second conductive trace, wherein a dielectric constant of the first dielectric substrate is different from a dielectric constant of the second dielectric substrate.

In some embodiments according to the present invention, the phase shifter may further include a first dielectric substrate below the first conductive trace, and a second dielectric substrate below the second conductive trace, wherein a thickness of the first dielectric substrate is different from a thickness of the second dielectric substrate.

In some embodiments according to the present invention, the first wiper may include a first coupling portion that is configured to couple to the first conductive trace, a second coupling portion that is configured to couple to the second conductive trace, and a third coupling portion that is configured to couple to the input port.

In some embodiments according to the present invention, a width of the first coupling portion may be substantially equal to a height of the first conductive trace.

In some embodiments according to the present invention, a width of the second coupling portion may be substantially equal to a height of the second conductive trace.

In some embodiments according to the present invention, the phase shifter may further include a third conductive trace that is coupled to the input port, wherein the third coupling portion is coupled to the input port via the third conductive trace.

In some embodiments according to the present invention, the third conductive trace may extend in the first direction.

In some embodiments according to the present invention, the phase shifter may further include a fifth output port configured to output an additional phase-shifted sub-component of the RF signal; a fourth conductive trace that is coupled to the fifth output port; and a second wiper that is configured to couple the fourth conductive trace to the third conductive trace, wherein the second wiper is slidable on the fourth conductive trace in the first direction to change a phase of the RF signal output from the fifth output port.

In some embodiments according to the present invention, a sliding of the second wiper may be associated with a sliding of the first wiper such that a phase of the additional phase-shifted sub-component of the RF signal output from the fifth output port remains substantially unchanged before and after the sliding of the first wiper.

In some embodiments according to the present invention, a distance slid by the second wiper may be proportional to a distance slid by the first wiper.

In some embodiments according to the present invention, the second wiper may be "U" shaped.

In some embodiments according to the present invention, the second wiper and the first wiper may be implemented as a single integrated member.

In some embodiments according to the present invention, the phase shifter may further include a third dielectric substrate below the third conductive trace; and a fourth dielectric substrate below the fourth conductive trace.

In some embodiments according to the present invention, a dielectric constant of the third dielectric substrate may be different from a dielectric constant of the fourth dielectric substrate.

In some embodiments according to the present invention, a thickness of the third dielectric substrate may be different from a thickness of the fourth dielectric substrate.

Another aspect of the present invention is directed to a phase shifter. The phase shifter includes an input port configured to receive a radio frequency (RF) signal; a first output port and a second output port each configured to output respective phase shifted sub-components of the RF signal; a first conductive trace configured to extend in a first direction that is coupled to the first output port and to the second output port; and a wiper configured to couple the input port to the first conductive trace, wherein the wiper is configured to be slidable above the first conductive trace in the first direction to change the phase of the respective sub-components of the RF signal that are output at the first output port and the second output port.

In some embodiments according to the present invention, the first conductive trace may be a periodic curve and the first conductive trace includes at least one period of the periodic curve.

In some embodiments according to the present invention, the periodic curve may include a sinusoidal curve and a square wave curve.

In some embodiments according to the present invention, the wiper may include a first coupling portion coupled to the first conductive trace, and the first coupling portion may have a width substantially equal to a height of the first conductive trace.

A further aspect of the present invention is directed to a phase shifter. The phase shifter includes a main printed circuit board structure that includes: an input port; a first meandered conductive trace that extends in a first direction on the main printed circuit board structure, the first meandered conductive trace forming a first RF transmission path that has a first length; a second meandered conductive trace that extends in the first direction on the main printed circuit board structure, the second meandered conductive trace forming a second RF transmission path that has a second length that exceeds the first length; and a wiper that is configured to move above the first meandered conductive trace along the first direction.

In some embodiments according to the present invention, the phase shifter may further include: a first output port that is coupled to a first end of the first meandered conductive trace; a second output port that is coupled to a second end of the first meandered conductive trace; a third output port that is coupled to a first end of the second meandered conductive trace; and a fourth output port that is coupled to a second end of the second meandered conductive trace.

In some embodiments according to the present invention, the first meandered conductive trace may have a wave shape having a first period and a first height, and the second meandered conductive trace may have a wave shape having a second period and a second height, where the first period differs from the second period and/or the first height differs from the second height.

In some embodiments according to the present invention, the wiper may be further configured to move above the second meandered conductive trace along the first direction.

In some embodiments according to the present invention, a first width of the first meandered conductive trace may be less than a second width of the second meandered conductive trace.

Further features of the present disclosure and its advantages will become clear from the detailed description of the exemplary embodiments of the invention.

BRIEF DESCRIPTION OF THE DRAWINGS

The accompanying drawings, which are part of the specification, illustrate example embodiments of the present invention, and can be used to explain the principles of these embodiments of the present invention together with the specification.

Note that, in the embodiments described below, the same reference number may be used to refer to the same parts or to refer to parts having the same functions that are shown in different drawings, and repeated description of such parts may be omitted. In some cases, similar reference numbers and/or letters may be used to indicate similar items. Thus, once an item is defined in a drawing, it may not be further discussed even though the item may also appear in subsequent drawings.

For the sake of easy understanding, the positions, sizes, ranges, and the like of the respective structures shown in the drawings may not represent actual positions, sizes, ranges, and the like. Therefore, the present disclosure is not limited to the positions, sizes, ranges, and the like disclosed in the drawings.

DETAILED DESCRIPTION

Various exemplary embodiments of the present disclosure will be described in detail below with reference to the drawings. It should be noted that the relative arrangement of the components and steps, numerical expressions and numerical values set forth in the embodiments are not intended to limit the scope of the present disclosure unless specifically illustrated otherwise.

The following description of the at least one exemplary embodiment is merely illustrative and has no intention to limit the application or use of the present application. That is, the structures and methods herein are shown in an illustrative manner to illustrate various embodiments of the structures and methods in the present disclosure. However, those skilled in the art will understand that they are merely illustrative of the exemplary embodiments of the present disclosure, and are not exhaustive. In addition, the drawings are not necessarily to be drawn in proportion, and some features may be enlarged to show details of some specific components.

Techniques, methods and apparatus known to those of skilled person in the relevant art may not be discussed in detail, but where appropriate, the techniques, methods and apparatus should be considered as a part of the specification.

In all of the examples shown and discussed herein, any specific values are to be construed as illustrative only and not as a limitation. Accordingly, other examples of the exemplary embodiments may have different values.

Figure 1:
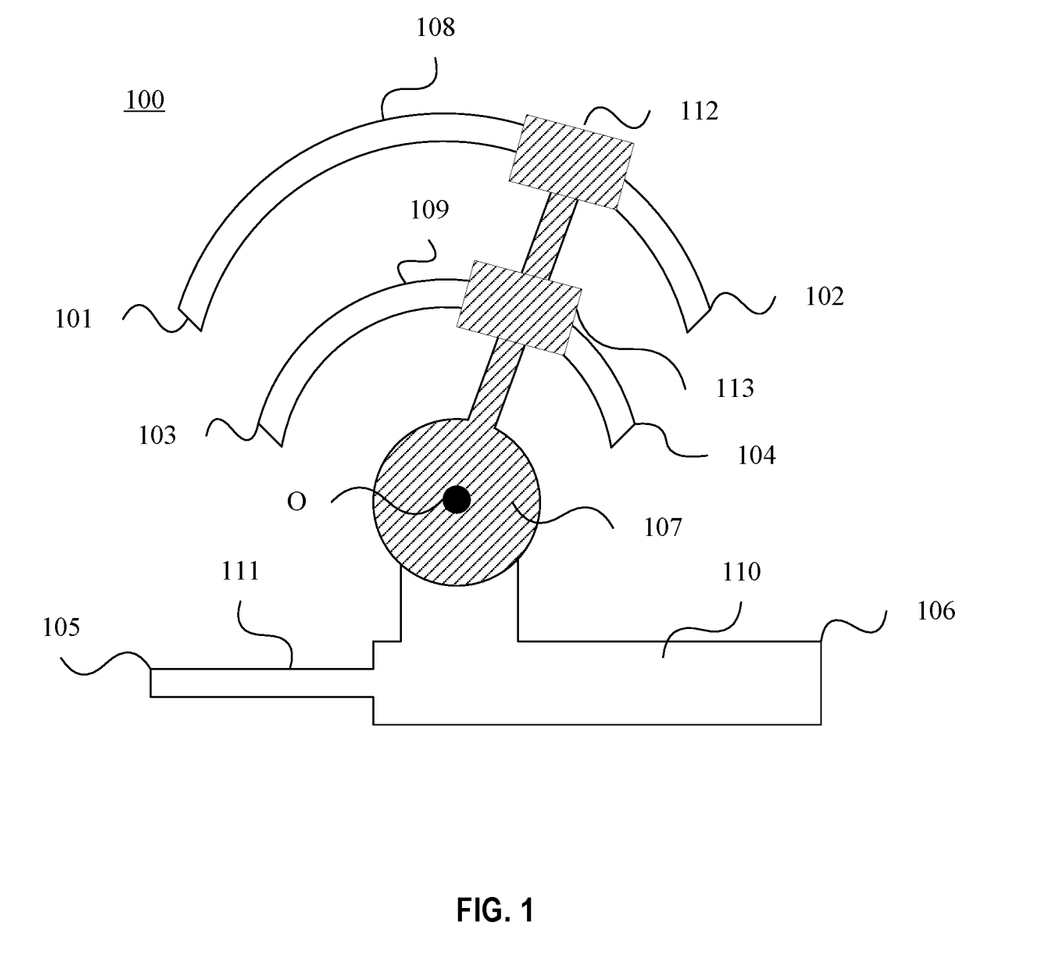
FIG. 1 is a schematic diagram of a conventional phase shifter.

FIG. 1 is a schematic diagram of a conventional phase shifter.

As shown in FIG. 1, the conventional phase shifter 100 includes an input port 106, an output port 101, an output port 102, an output port 103, an output port 104, an output port 105, and a wiper 107.

Output port 101 and output port 102 are coupled to a coupling portion 112 of the wiper 107 by a first arc-shaped conductive trace 108, output port 103 and output port 104 are coupled to the coupling portion 113 of the wiper 107 by a second arc-shaped conductive trace 109, and input port 106 is coupled to the wiper 107 via a conductive trace 110. Thus, an RF signal input at input port 106 can be transmitted to output ports 101, 102, 103 and 104 via the wiper 107 and the conductive traces 108, 109, 110.

As shown in FIG. 1, the wiper 107 is rotatable about a central axis O. As the wiper 107 rotates, portions of the wiper 107 that are arranged to electromagnetically couple with conductive trace 108 and conductive trace 109 (i.e., the coupling portion 112 and the coupling portion 113) move above arc-shaped conductive trace 108 and arc-shaped conductive trace 109, respectively. Thus, the lengths of the respective signal transmission paths from the input port 106 to the output ports 101, 102, 103, 104 change. The RF signal input at input port 106 is transmitted to each output port 101-104 through the changed transmission paths, and the phases of the output signals also change accordingly.

Furthermore, as shown in FIG. 1, an output port 105 is coupled to the input port 106 by a conductive trace 111 and the conductive trace 110. The RF signal input at input port 106 is transmitted directly to the output port 105 via the conductive traces 110, 111, without passing through the wiper 107. It will be appreciated that an RF signal that is input to phase shifter 100 at input port 106 is split into two sub-components at the intersection of conductive traces 110 and 111, as the intersection of the two traces act as a power divider, and that a first sub-component of the RF signal will pass to the wiper 107 while the second sub-component of the RF signal will pass to output port 105 via conductive trace 111. Likewise, a power divider (not visible in FIG. 1) is provided on the wiper 107 that further sub-divides the first sub-component of the RF signal that is passed onto the wiper 107 into third and fourth sub-components so that the third sub-component is passed to coupling portion 112 while the fourth sub-component is passed to coupling portion 113. The portion of the third sub-component of the RF signal that couples from coupling portion 112 to the arc-shaped conductive trace 108 is further sub-divided into fifth and sixth sub-components as it passes to arc-shaped conductive trace 108, with the fifth sub-component travelling in a first direction on arc-shaped conductive trace 108 to output port 101, and the sixth sub-component travelling in a second direction on arc-shaped conductive trace 108 to output port 102. Similarly, the portion of the fourth sub-component of the RF signal that couples from coupling portion 113 to arc-shaped conductive trace 109 is further sub-divided into seventh and eighth sub-components as it passes to arc-shaped conductive trace 109, with the seventh sub-component travelling in a first direction on arc-shaped conductive trace 109 to output port 103, and the eighth sub-component travelling in a second direction on arc-shaped conductive trace 109 to output port 104. Thus, the RF signal input at input port 106 may eventually be sub-divided into five sub-components that are passed to output ports 101-105, respectively.

The sub-component of the RF signal that is passed to output port 105 undergoes a fixed phase shift (that is determined by, among other things, the length of the transmission path from input port 106 to output port 105 and the frequency of the RF signal), while the sub-components of the RF signal that are passed to output ports 101-104 are subjected to respective variable phase shifts, with the amount of the phase shifts depending upon the relative position of the wiper 107 above the arc-shaped conductive traces 108, 109. Typically, the phase shifter 100 is designed so that when the wiper 107 is positioned above the respective mid-points of arc-shaped traces 108, 109, the sub-components of the RF signals output at output ports 101-105 will all experience the same amount of phase shift. When the wiper 107 is moved, for example, to the position shown in FIG. 1, the sub-component of the RF signal output at output port 104 will experience the smallest phase shift, the sub-component of the RF signal output at output port 102 will experience the next smallest phase shift, the sub-component of the RF signal output at output port 105 will experience the next smallest phase shift, the sub-component of the RF signal output at output port 103 will experience the next to largest phase shift, and the sub-component of the RF signal output at output port 101 will experience the largest phase shift. The farther the wiper 107 is moved from the central position the larger the relative phase shifts between the sub-components output at output ports 101-105.

In the phase shifter 100 shown in FIG. 1, the rotation of the wiper 107 is generally achieved by pulling the wiper 107 along the horizontal direction in FIG. 1. As the angle of deflection of the wiper 107 increases, the required pulling force also increases. Furthermore, when the wiper 107 is pulled horizontally, it is difficult to control radians of the arc-shaped conductive traces 108 and 109 that the coupling portions 112 and 113 pass through, often resulting the wiper 107 to an inaccurate angle. In addition, since the conductive traces 108 and 109 are both arc-shaped, the occupied space is relatively large, which makes it difficult to reduce the size of phase shifter 100.

Figure 2:
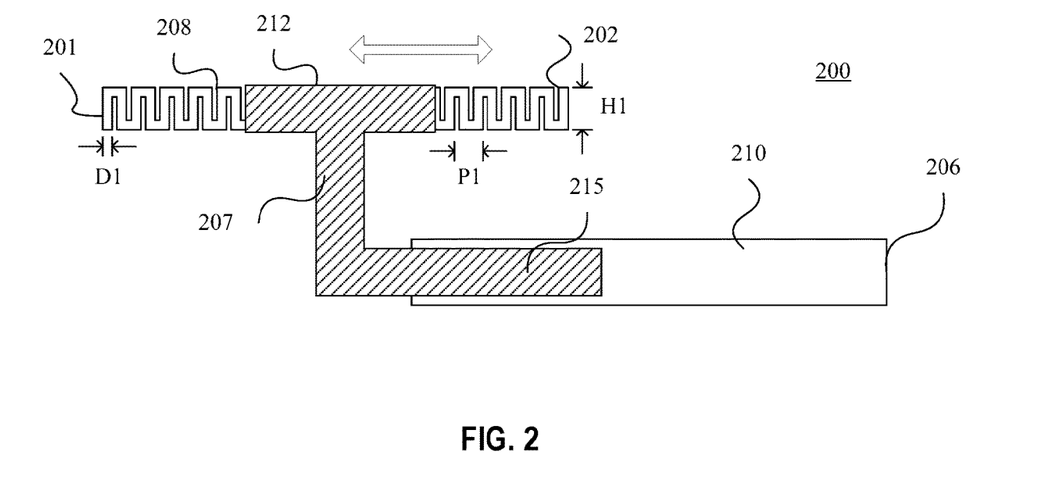
FIG. 2 is a schematic diagram of a phase shifter in accordance with one or more exemplary embodiments of the present invention.

FIG. 2 is a schematic diagram of a phase shifter in accordance with some embodiments of the present invention. As shown in FIG. 2, phase shifter 200 includes an input port 206, output ports 201 and 202, a wiper 207, and conductive traces 208 and 210. The input port 206, output ports 201 and 202, and conductive traces 208 and 210 may be implemented, for example, as conductive traces/pads/regions on a main printed circuit board structure that may include one or more printed circuit boards. The wiper 207 may also be implemented as and/or include a wiper printed circuit board structure. A first coupling portion 215 of the wiper 207 (which may be, for example, a conductive pad on the side of the wiper printed circuit board structure that faces the main printed circuit board structure) is coupled to the input port 206 by a conductive trace 210, and a second coupling portion 212 of the wiper 207 is coupled to the output ports 201 and 202 by the conductive trace 208. An RF signal that is input to phase shifter 200 at input port 206 passes, in turn, to conductive trace 210 and wiper 207, and the RF signal is split into two sub-components once it couples to conductive trace 208, and these two sub-components pass in opposite directions along conductive trace 208 and are output at output ports 201 and 202. As the RF signal passes through phase shifter 200 the phase of the RF signal changes, and the two phase-shifted sub-components of the RF signal are output at output ports 201 and 202.

In the illustrative embodiment shown in FIG. 2, the conductive trace 208 extends in a horizontal direction (a first direction, as indicated by the arrow). When the wiper 207 slides in the horizontal direction, the length of the respective transmission paths from input 206 to outputs 201 and 202 change. For example, when the wiper 207 slides to the right along the horizontal direction, the length of the signal transmission path from input port 206 to output port 202 becomes shorter, and the length of the signal transmission path from input port 206 to output port 201 becomes longer, resulting in changes to the phases of the respective sub-components of the RF signal that are output at output ports 201 and 202.

In order to increase the amount of phase change that is imparted to the two sub-components of the RF signal, the conductive trace 208 is implemented as a meandered conductive trace. In the embodiment of FIG. 2, the meandered conductive trace 208 has the shape of a periodic curve. For example, in FIG. 2, the conductive trace 208 has the shape of a square wave curve. It should be understood that when the wiper 207 slides above the conductive trace 208 by a predetermined distance in the horizontal direction, the phases of the sub-components of the RF signal that are output at output ports 201 and 202 have a corresponding amount of change. For the conductive trace 208 of the periodic curve shape, the amount of change in the phases of the respective sub-components of the RF signal can be adjusted by adjusting, among other things, a width D1, a period P1, and/or a height H1 of the conductive trace 208.

As shown in FIG. 2, herein the period P1 of the conductive trace 208 refers to a dimension of one period of the conductive trace in the horizontal direction (first direction) when the conductive trace 208 is a periodic curve. The height H1 of the conductive trace 208 is a dimension of the conductive trace 208 in a direction perpendicular to the horizontal direction.

Figure 3:
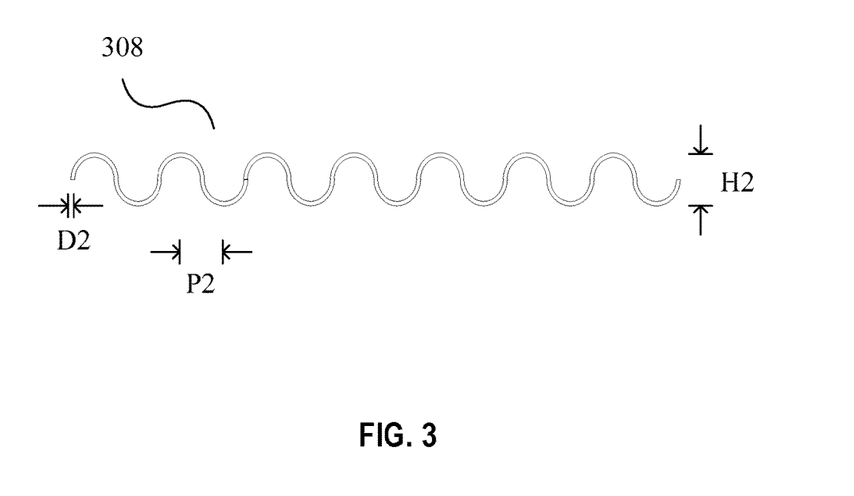
FIG. 3 is a schematic diagram of a conductive trace in accordance with one or more exemplary embodiments of the present invention.

As shown in FIG. 3, in other example embodiments of the present invention, the conductive trace 308 may alternatively have a different shape, such as a sinusoid curve having a width D2, a period P2, and a height H2. As described above, the width D2 of the conductive trace 308, the period P2, and/or the height H2 may be set such that the phases of the sub-components of the RF signals that are output at either end of conductive trace 308 may have a predetermined amount of change when a corresponding wiper (not shown in FIG. 3) slides a predetermined distance in the horizontal direction.

Figure 4:
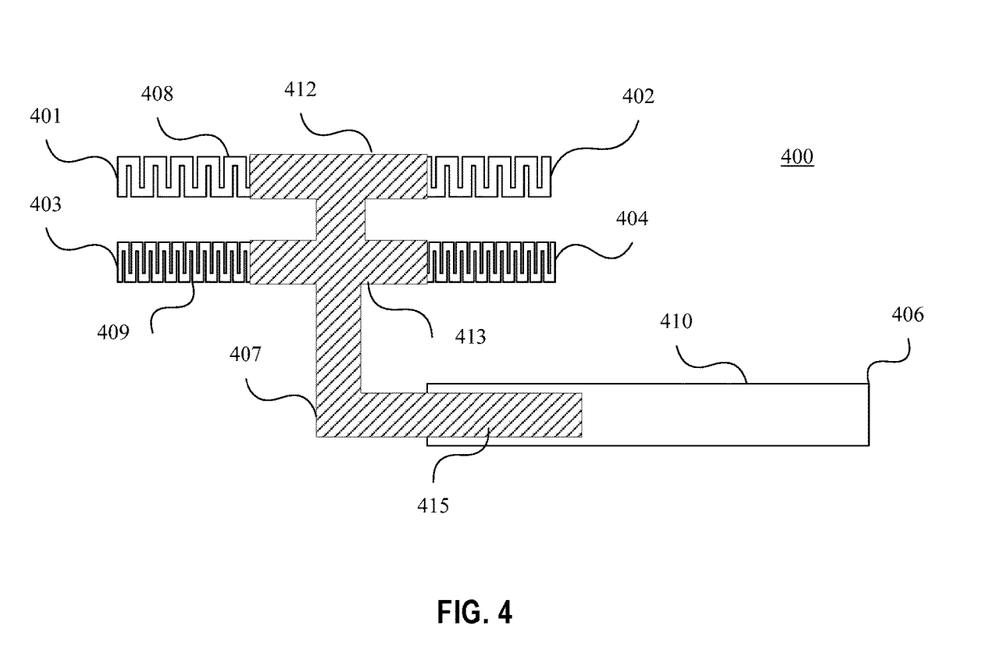
FIG. 4 is a schematic diagram of a phase shifter in accordance with one or more exemplary embodiments of the present invention.

FIG. 4 is a schematic diagram of a phase shifter 400 in accordance with further embodiments of the present invention. As shown in FIG. 4, phase shifter 400 includes conductive traces 408, 409 and 410, an input port 406, output ports 401, 402, 403 and 404, and a wiper 407. Phase shifter 400 may be identical to phase shifter 200 except that phase shifter 400 further includes a second meandered trace 409 and the wiper 407 includes a second coupling portion 413, each of which will be described in greater detail below.

A first coupling portion 415 of wiper 407 is coupled to input port 406 through conductive trace 410, a second coupling portion 412 of the wiper 407 is coupled to output ports 401 and 402 through conductive trace 408, and a third coupling portion 413 of the wiper 407 is coupled to output ports 403 and 404 through conductive trace 409. An RF signal that is input at input port 406 is sub-divided into four sub-components, and first and second of the sub-components are transmitted to output ports 401 and 402 via conductive trace 410, the wiper 407 and conductive trace 408, and the third and fourth sub-components are transmitted to output ports 403 and 404 via conductive trace 410, wiper 407 and conductive trace 409. Thus, the sub-components of the RF signal that are output at output ports 401, 402, 403 and 404 may have different phases.

In the phase shifter 400 shown in FIG. 4, conductive trace 410 (i.e., the third conductive trace), conductive trace 408 (i.e., the first conductive trace), and conductive trace 409 (i.e., the second conductive trace) all extend in the horizontal direction (the first direction). When it is necessary to adjust the phases of the sub-components of an RF signal that are output at output ports 401, 402, 403 and 404, the wiper 407 can slide in the horizontal direction, and the coupling portion 412 and the coupling portion 413 slide above the conductive trace 408 and the conductive trace 409, respectively. The lengths of the respective RF transmission paths from input port 406 to output ports 401-404 change, thereby changing the phases of the sub-components of the RF signal that are output at output ports 401, 402, 403 and 404.

Furthermore, in the phase shifter 400 shown in FIG. 4, conductive trace 408 and conductive trace 409 are both in the shape of a square wave curve. However, the widths and the periods of the respective square wave curves of conductive traces 408 and 409 are different. Thus, when the wiper 407 slides a certain distance in the horizontal direction, the amount of change in the phases of the sub-components of RF signal that are output at output ports 401 and 402 are different from the amount of change in the phases of the sub-components of RF signal that are output at output ports 403 and 404.

Figure 5:
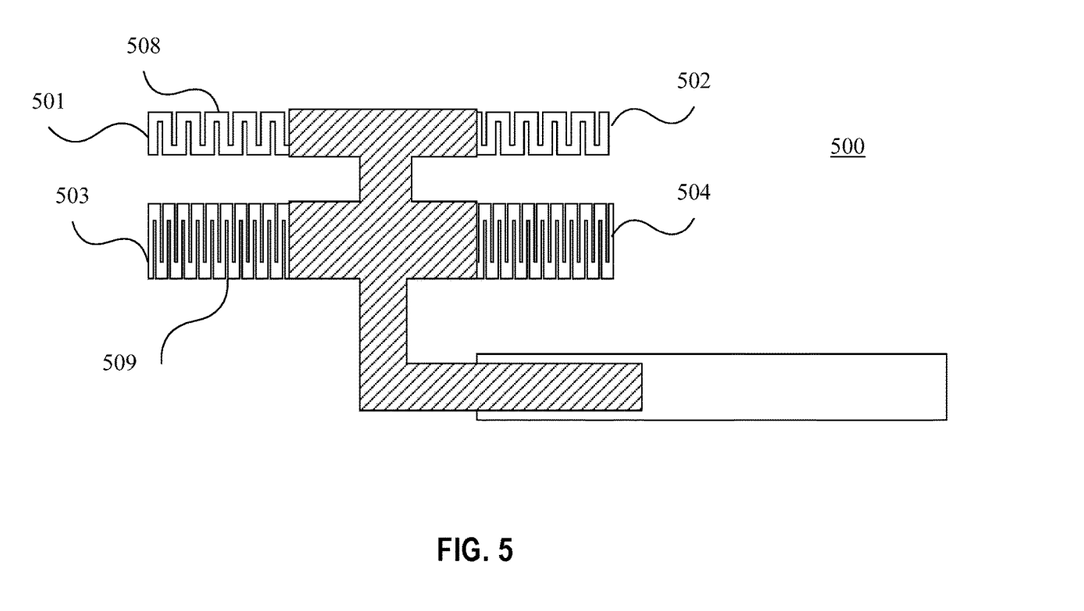
FIG. 5 is a schematic diagram of a phase shifter in accordance with one or more exemplary embodiments of the present invention.

FIG. 5 is a schematic diagram of a phase shifter 500 in accordance with still further embodiments of the present invention. As shown in FIG. 5, the phase shifter 500 differs from the phase shifter 400 of FIG. 4 in that conductive trace 508 and conductive trace 509 have different heights. By increasing the height of the square wave of conductive trace 509 relative to conductive trace 508, the amount of change in the phases of the sub-components of the RF signal that are output at output ports 503 and 504 may be further increased relative to the amount of change imparted in the phases of the sub-components of the RF signal that are output at output ports 501 and 502.

Further, with respect to the phase shifter 400 shown in FIG. 4, in order to increase the difference between the amount of change in the phases of the sub-components of the RF signals that are output at output ports 401 and 402 and the amount of change in the phases of the sub-components of the RF signals that are output at output ports 403 and 404, the dielectric under the conductive trace 408 and the conductive trace 409 can also be adjusted. This will be further explained with reference to FIG. 6.

Figure 6:
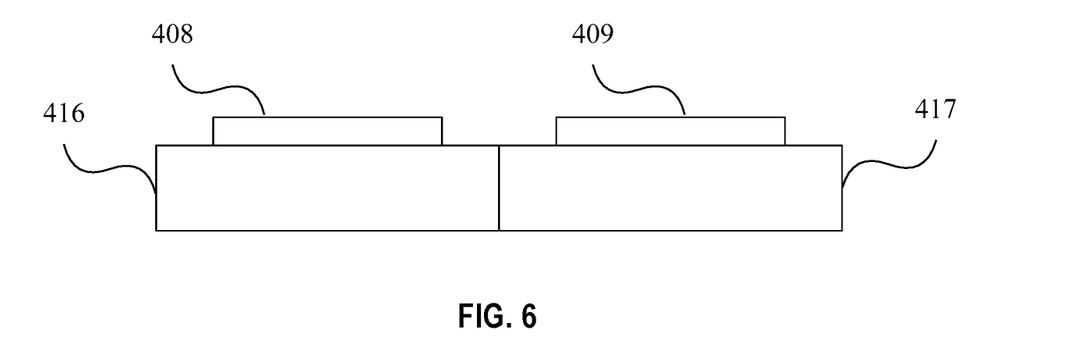
FIG. 6 is a cross-sectional view of a phase shifter in accordance with one or more exemplary embodiments of the present invention.

FIG. 6 is a schematic cross-sectional view of the phase shifter 400 of FIG. 4. As shown in FIG. 6, the conductive trace 408 and the conductive trace 409 can be formed on different dielectric substrates, respectively. Specifically, conductive trace 408 is on a dielectric substrate 416 (first dielectric substrate), and conductive trace 409 is on a dielectric substrate 417 (second dielectric substrate). The dielectric substrate 416 and the dielectric substrate 417 have different dielectric constants, thereby increasing the difference between the amount of change in the phases of the sub-components of the RF signals that are output at output ports 401 and 402 and the amount of change in the phases of the sub-components of the RF signals that are output at output ports 403 and 404. For example, in some embodiments, the dielectric substrate 416 has a dielectric constant greater than the dielectric constant of the dielectric substrate 417. In other embodiments, the dielectric substrate 416 has a dielectric constant less than the dielectric constant of the dielectric substrate 417.

The dielectric substrate 416 and the dielectric substrate 417 can be formed in a variety of ways. For example, dielectric substrate 416 may comprise a printed circuit board formed with a first dielectric material and dielectric substrate 417 may comprise a printed circuit board formed with a second dielectric material.

Figure 7:
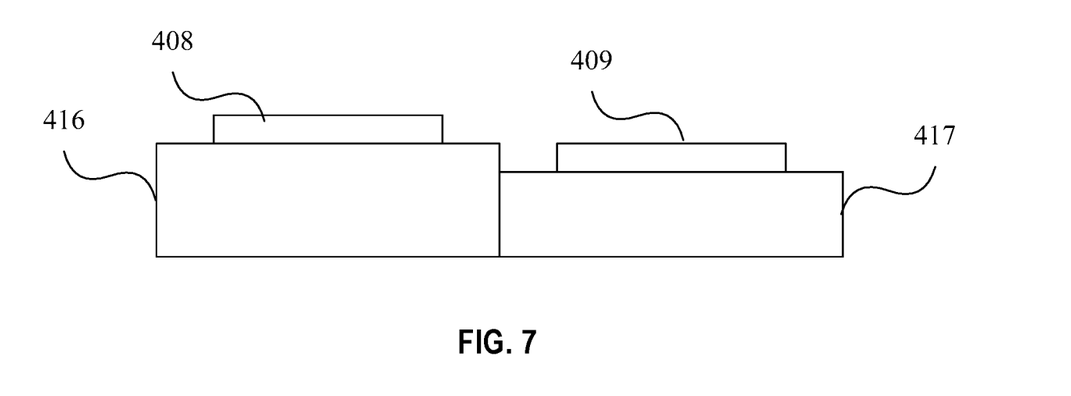
FIG. 7 is a cross-sectional view of a phase shifter in accordance with one or more exemplary embodiments of the present invention.

FIG. 7 is a cross-sectional view of another implementation of the phase shifter 400 in accordance with still further embodiments of the present invention. As shown in FIG. 7, conductive trace 408 is on dielectric substrate 416, and conductive trace 409 is on dielectric substrate 417. In the embodiment illustrated in FIG. 7, dielectric substrate 416 and dielectric substrate 417 are made of the same dielectric material (i.e., have the same dielectric constant). However, the thickness of dielectric substrate 416 is greater than the thickness of dielectric substrate 417. Thus, it is also possible to increase the difference between the amount of change in the phases of the sub-components of the RF signal that are output at output ports 401 and 402 and the amount of change in the phases of the sub-components of the RF signal that are output at output ports 403 and 404.

It should be understood that the thicknesses of the dielectric substrates 416 and 417 may be set according to actual needs, and are not limited to the manner shown in FIG. 7. For example, in some other embodiments in accordance with the present disclosure, the thickness of the dielectric substrate 416 can be less than the thickness of the dielectric substrate 417.

Moreover, in the embodiment illustrated in FIG. 4, the width of the coupling portion 412 is substantially equal to the height of the conductive trace 408, and the width of the coupling portion 413 is substantially equal to the height of the conductive trace 409. However, embodiments of the present invention are not limited thereto, and the widths of the coupling portions 413 and 412 may be set according to actual needs as long as signal transmission between the wiper 407 and the conductive traces 408, 409 can be ensured.

In the phase shifter 400 of FIG. 4, both the conductive trace 408 and conductive trace 409 extend along a straight line. Compared to the arc-shaped conductive traces shown in FIG. 1, the spacing between the conductive traces can be further reduced, thereby facilitating the implementation of smaller size phase shifters.

In an example embodiment of the phase shifter 400 shown in FIG. 4, a length of an RF transmission path along a section of conductive trace 409 may be designed to be three times a length of an RF transmission path along a section of conductive trace 408 that has the same as the section of conductive trace 409. Herein, the length of an RF transmission path refers to the physical distance that an RF signal will travel when passing along the RF transmission path. The length of the RF transmission path formed by the meandered conductive traces exceeds the length of the meandered conductive traces in the first direction, as the RF signal will follow the meandered route along the meandered conductive trace.

In the embodiment of FIG. 4, a phase change experienced by a sub-component of the RF signal that passes through the section of conductive trace 409 will be three times of the phase change of a sub-component of the RF signal that passes through the section of conductive trace 408. When the wiper 407 is moved to the left by a distance, the phase of the sub-component of the RF signal at the coupling portion 415 has a change of $-\delta x$, and the phase of the sub-component of the RF signal at the output port 401 has a change of $\delta\varphi-\delta x$, the phase of the sub-component of the RF signal at the output port 402 has a change of $-\delta\varphi-\delta x$, the phase of the sub-component of the RF signal at the output port 403 has a change of $3\delta\varphi-\delta x$, and the phase of the sub-component of the RF signal at output port 404 has a change of $-3\delta\varphi-\delta x$.

Figure 8:
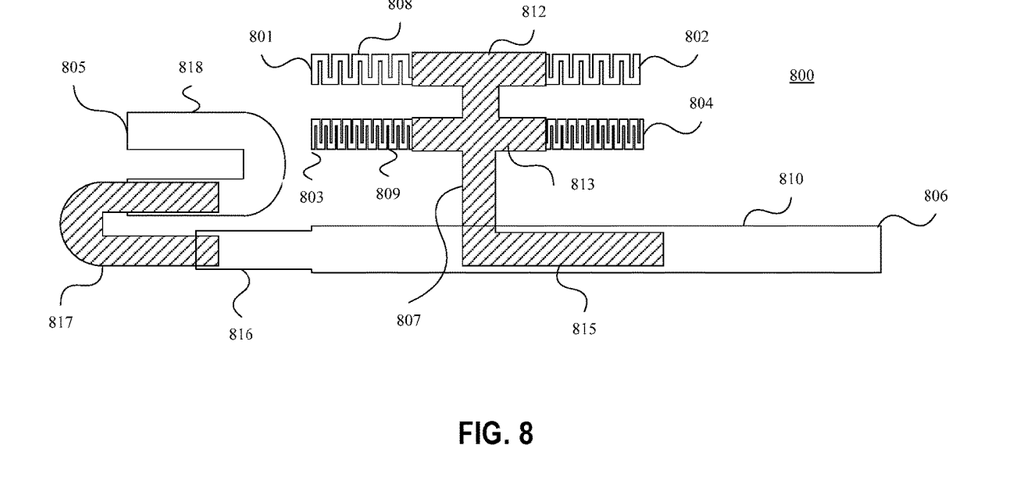
FIG. 8 is a schematic diagram of a phase shifter in accordance with one or more exemplary embodiments of the present invention.

FIG. 8 is a schematic diagram of a phase shifter in accordance with still further embodiments of the present invention. As shown in FIG. 8, the phase shifter 800 includes conductive traces 808, 809, 810, 816 and 818, an input port 806, output ports 801, 802, 803, 804 and 805, and a wiper 807 (i.e., the first wiper) and a wiper 817 (i.e., the second wiper). The conductive trace 818 and conductive trace 816 together form a fourth conductive trace.

The coupling portion 815 of the wiper 807 is coupled to the input port 806 by conductive trace 810, the coupling portion 812 of the wiper 807 is coupled to output ports 801 and 802 by conductive trace 808, and coupling portion 813 of the wiper 807 is coupled to output ports 803 and 804 by conductive trace 809. The wiper 817 may be, for example, "U" shaped. One end of wiper 817 is coupled to the output port 805 by a U-shaped conductive trace 818 and the other end of the wiper 817 is coupled to the input port 806 by conductive trace 816 and conductive trace 810. An RF signal may be input at input port 806 and sub-divided into five sub-components in a manner similar to the manner in which an RF signal input to phase shifter 100 of FIG. 1 is sub-divided into five sub-components. First and second of the sub-components are transmitted to output ports 801 and 802 via the conductive trace 810, wiper 807, and conductive trace 808. Third and fourth of the sub-components are transmitted to output ports 803 and 804 via conductive trace 810, wiper 807, and conductive trace 809. The fifth sub-component is transmitted to output port 805 via conductive trace 810, conductive trace 816, wiper 817, and conductive trace 818. Thus, the sub-components of the RF signal that are output at output ports 801, 802, 803, 804 and 805 may have different phases.

In the phase shifter 800 shown in FIG. 8, the conductive traces 810, 808, 809 and 816 all extend in the horizontal direction (first direction). When it is necessary to adjust the phases of the sub-component of the RF signal that are output at output ports 801, 802, 803 and 804, wiper 807 may be slid in the horizontal direction, and the coupling portions 812 and 813 slide above conductive traces 808 and 809, respectively. The lengths of the transmission paths through the phase shifter 800 change, thereby changing the phases of the sub-component of the RF signal that are output at output ports 801, 802, 803 and 804.

Additionally, conductive trace 818 is U-shaped. When the wiper 807 slides in the horizontal direction, the phase of the sub-component of the RF signal that is output at output port 805 also changes. In order to keep the phase of the sub-component of the RF signal that is output at output port 805 constant, the wiper 817 can also slide a certain distance in the horizontal direction. It should be understood that the sliding distance of the wiper 817 and the sliding distance of the wiper 807 should satisfy a predetermined proportional relationship to keep the phase of the sub-component of the RF signal that is output at output port 805 constant. For example, wiper 817 and the wiper 807 may be coupled to a first gear (not shown) and a second gear (not shown), respectively, and the first gear and the second gear engage with each other and have a predetermined gear ratio such that when the wiper 807 slides in the horizontal direction, the wiper 817 also slides in the horizontal direction by a corresponding distance.

Moreover, in some embodiments in accordance with the present invention, wiper 807 and wiper 817 can be an implemented as a single integrated member. In such embodiments, when wiper 807 slides in the horizontal direction, wiper 817 also slides the same distance in the horizontal direction. In this case, in order to keep the phase of the RF signal output from the output port 805 unchanged, parameters such as the height of the conductive traces 816 and 818, the type and thickness of the dielectric material of the dielectric substrate under the conductive traces 816 and 818 and the like may be set to control the relationship between the sliding distance of the wiper 817 and the phase change of the RF signal of the output port 805, so that when the sliding distance of the wiper 817 is the same as the sliding distance of the wiper 807, the phase of the RF signal output from the output port 805 does not change. For example, similar to FIGS. 6-7, the parameters (for example, thickness, dielectric material, and the like) of the dielectric substrate (third conductive substrate) under the conductive trace 810 and the dielectric substrate (fourth conductive substrate) under the fourth conductive traces (816, 818) can be adjusted.

Moreover, it should be understood that in FIG. 8, the conductive traces 818 and 816 are shown as solid traces that extend along respective straight lines (or along the same straight line). In other embodiments, the conductive traces 818 and 816 can also be periodic curves. Moreover, in some embodiments, the phase of the sub-component of the RF signal that is output at output port 805 may change with the sliding of wiper 817 and wiper 807 and not remain constant.

In the phase shifter 800 shown in FIG. 8, the input port 806 and the conductive trace 810 coupled thereto are both located on one side of the conductive traces 808 and 809. It should be understood that the input port 806 and the conductive trace 810 coupled thereto can also be located between the conductive traces 808 and 809.

Figure 9:
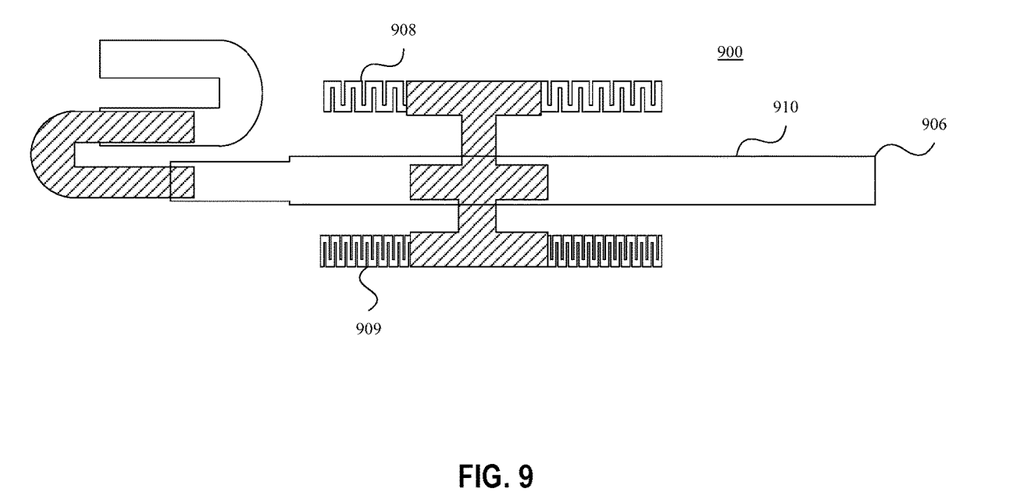
FIG. 9 is a schematic diagram of a phase shifter in accordance with one or more exemplary embodiments of the present invention.

FIG. 9 shows a schematic diagram of a phase shifter in accordance with further embodiments of the present invention. As shown in FIG. 9, in the phase shifter 900, an input port 906 and a conductive trace 910 coupled thereto are located between the conductive traces 908 and 909. The other structures of the phase shifter 900 are similar to those of the phase shifter 800 shown in FIG. 8, and will not be repeated here.

The terms "before", "after", "top", "bottom", "above", "below", etc. in the specification and claims, if present, are for descriptive purpose and not necessarily used to describe an unchanged relative position. It will be understood that the terms are interchangeable in appropriate situations. The embodiments of the present disclosure described herein are, for example, capable of operating in orientation other than those shown or described herein.

As used in the present disclosure, the term "exemplary" means "serving as an example, instance, or illustration" rather than as a "model" to be precisely copied. Any embodiments exemplarily described herein are not necessarily to be construed as preferred or advantageous over other embodiments. Furthermore, the present disclosure is not limited by any of the stated or implied theory presented in the above technical field, the background, the summary or the detailed description of the embodiments.

As used herein, the term "substantially" is intended to include any minor variation resulting from a design or manufacturing defect, a device or component tolerance, environmental influence, and/or other factors. The term "substantially" also allows for deviation from perfect or ideal situations caused by parasitic effects, noise, and other practical considerations that may exist in actual implementations.

In addition, the foregoing description may refer to elements or nodes or features that are "connected" or "coupled" together. As used herein, "connect" means that an element/node/feature is directly connected electrically, mechanically, logically, or otherwise to (or directly communicate with) another element/node/feature, unless otherwise explicitly stated. Similarly, "couple" means that an element/node/feature may be mechanically, electrically, logically, or otherwise linked to another element/node/feature in a direct or indirect manner, unless explicitly stated otherwise to allow interaction, even if these two features may not be directly connected. That is, "couple" is intended to include both direct and indirect connection of elements or other features, and includes a connection with one or more intermediate elements.

In addition, the terms "first", "second", and the like may also be used herein for the purpose of reference only, and thus are not intended to be limiting. For example, the terms "first", "second", and other such numerical terms referring to the structure or element do not imply the sequence or order, unless specifically pointed out in the context.

It is also to be understood that the terms "comprise/include" herein means that the described features, steps, operations, units and/or components exist, but the existence or adding of one or more other features, steps, operations, units and/or components and/or combinations thereof are not excluded.

Those skilled in the art will appreciate that the boundaries between the above operations are merely illustrative. Multiple operations may be combined into a single operation, a single operation may be distributed among additional operations, and operations may be performed at least partially overlapping in time. Moreover, alternative embodiments may include multiple instances of a particular operation, and the operational sequence may be varied in other various embodiments. However, other modifications, changes, and substitutions are equally possible. Accordingly, the specification and drawings are to be regarded as illustrative rather than limiting.

While some specific embodiments of the present disclosure have been described in detail by way of example, a skilled person should be understood that the above examples are for illustrative purpose and have no intention to limit the scope of the present disclosure. The embodiments disclosed in the present disclosure may be combined in any manner without departing from the spirit and scope of the present disclosure. It will be understood by a person skilled in the art that various modifications may be made to the embodiments without departing from the scope and spirit of the present disclosure. The scope of the present disclosure is defined by the appended claims.

That which is claimed is:

1. A phase shifter, comprising:
    an input port configured to receive a radio frequency (RF) signal;
    a first output port, a second output port, a third output port, and a fourth output port each configured to output a respective phase-shifted sub-component of the RF signal;
    a first conductive trace that extends linearly along a first longitudinal axis, the first conductive trace coupled to the first output port and the second output port;
    a second conductive trace that extends linearly along a first longitudinal axis that extends in parallel to the first longitudinal axis, the second conductive trace coupled to the third output port and the fourth output port; and a first wiper configured to couple the input port to the first conductive trace and the second conductive trace, wherein the first wiper is configured to be slidable in a direction that is parallel to the first longitudinal axis.

2. The phase shifter according to claim 1, wherein at least one of the first conductive trace and the second conductive trace is a meandered trace.

3. The phase shifter according to claim 2, wherein the meandered trace is a periodic curve.

4. The phase shifter according to claim 3, wherein the periodic curve is one of a sinusoidal curve and a square wave curve.

5. The phase shifter according to claim 2, wherein both the first conductive trace and the second conductive trace are periodic curves and a period of the first conductive trace is different from a period of the second conductive trace.

6. The phase shifter according to claim 5, wherein a height of the first conductive trace is different from a height of the second conductive trace.

7. The phase shifter according to claim 5, wherein a width of the first conductive trace is different from a width of the second conductive trace.

8. The phase shifter according to claim 2, further comprising:
a first dielectric substrate below the first conductive trace; and
a second dielectric substrate below the second conductive trace, wherein a dielectric constant of the first dielectric substrate is different from a dielectric constant of the second dielectric substrate.

9. The phase shifter according to claim 2, further comprising:
a first dielectric substrate below the first conductive trace; and
a second dielectric substrate below the second conductive trace,
wherein a thickness of the first dielectric substrate is different from a thickness of the second dielectric substrate.

10. The phase shifter according to claim 1, wherein the first wiper comprises:
a first coupling portion that is configured to couple to the first conductive trace;
a second coupling portion that is configured to couple to the second conductive trace; and
a third coupling portion that is configured to couple to the input port.

11. The phase shifter according to claim 10, further comprising:
a third conductive trace that is coupled to the input port, wherein the third coupling portion is coupled to the input port via the third conductive trace.

12. The phase shifter according to claim 11, further comprising:
a fifth output port configured to output an additional phase-shifted sub-component of the RF signal;
a fourth conductive trace that is coupled to the fifth output port; and
a second wiper that is configured to couple the fourth conductive trace to the third conductive trace, wherein the second wiper is slidable on the fourth conductive trace in the first direction to change a phase of the RF signal output from the fifth output port.

13. The phase shifter according to claim 12, wherein a sliding of the second wiper is associated with a sliding of the first wiper such that a phase of the additional phase-shifted sub-component of the RF signal output from the fifth output port remains substantially unchanged before and after the sliding of the first wiper.

14. The phase shifter according to claim 13, wherein the second wiper is "U" shaped.

15. A phase shifter, comprising:
an input port configured to receive a radio frequency (RF) signal;
a first output port and a second output port each configured to output respective phase shifted sub-components of the RF signal;
a first conductive trace configured to extend linearly along a first longitudinal axis and that is coupled to the first output port and to the second output port; and
a wiper configured to couple the input port to the first conductive trace,
wherein the wiper is configured to be slidable above the first conductive trace parallel to the first longitudinal axis to change the phase of the respective sub-components of the RF signal that are output at the first output port and the second output port.

16. A phase shifter comprising:
a main printed circuit board structure that includes:
an input port;
a first meandered conductive trace that extends linearly along a first longitudinal axis on the main printed circuit board structure, the first meandered conductive trace forming a first RF transmission path that has a first length;
a second meandered conductive trace that extends linearly along a second longitudinal axis on the main printed circuit board structure, the second longitudinal axis parallel to the first longitudinal axis, the second meandered conductive trace forming a second RF transmission path that has a second length that exceeds the first length; and
a wiper that is configured to move above the first meandered conductive trace parallel to the first longitudinal axis.

17. The phase shifter according to claim 16, further comprising:
a first output port that is coupled to a first end of the first meandered conductive trace;
a second output port that is coupled to a second end of the first meandered conductive trace;
a third output port that is coupled to a first end of the second meandered conductive trace; and
a fourth output port that is coupled to a second end of the second meandered conductive trace.

18. The phase shifter according to claim 16, wherein the first meandered conductive trace has a wave shape having a first period and a first height, and the second meandered conductive trace has a wave shape having a second period and a second height, where the first period differs from the second period and/or the first height differs from the second height.

19. The phase shifter according to claim 16, wherein the wiper is further configured to move above the second meandered conductive trace along the first direction.

20. The phase shifter according to claim 16, wherein a first width of the first meandered conductive trace is less than a second width of the second meandered conductive trace.

* * * * *